(12) United States Patent
Mastromatteo

(10) Patent No.: US 7,888,589 B2
(45) Date of Patent: Feb. 15, 2011

(54) PHOTOVOLTAIC DEVICE WITH CONCENTRATION AND SPECTRAL SPLITTING OF COLLECTED LIGHT BEAM

(75) Inventor: Ubaldo Mastromatteo, Bareggio (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 0 days.

(21) Appl. No.: 12/494,838

(22) Filed: Jun. 30, 2009

(65) Prior Publication Data
US 2010/0000593 A1 Jan. 7, 2010

(30) Foreign Application Priority Data
Jul. 3, 2008 (IT) .......................... VA2008A0042

(51) Int. Cl.
*H01L 31/042* (2006.01)
(52) U.S. Cl. .................. 136/246; 136/251; 136/255; 136/257; 136/259
(58) Field of Classification Search .......... 136/243–293
See application file for complete search history.

(56) References Cited

U.S. PATENT DOCUMENTS

| 1,219,514 | A | * | 3/1917 | Whitney | .................. | 246/473.3 |
| 2,379,790 | A | * | 7/1945 | Dimmick | ................... | 359/586 |
| 4,003,756 | A | * | 1/1977 | Abrams | ..................... | 136/246 |
| 4,297,521 | A | * | 10/1981 | Johnson | ..................... | 136/248 |
| 4,395,581 | A | * | 7/1983 | Girard | ......................... | 359/853 |
| 5,920,347 | A | * | 7/1999 | Aoki | .......................... | 348/339 |
| 6,689,949 | B2 | * | 2/2004 | Ortabasi | ..................... | 136/246 |
| 2003/0185525 | A1 | * | 10/2003 | Lacy et al. | ..................... | 385/92 |
| 2003/0196726 | A1 | * | 10/2003 | Tucker et al. | ............... | 144/372 |

OTHER PUBLICATIONS

Lewis, Carol et al., "Multi-Bandgap High Efficiency Converter (Rainbow)," Proceedings of the 32$^{nd}$ Intersociety Energy Conversion engineering Conference. Aerospace Power Systems and Technologies, Honolulu, Hawaii, Jul. 27-Aug. 1, 1997; [Intersociety Energy Conversion Conference], New York, NY: IEEE, vol. 1, New York, Jul. 27, 1997, pp. 401-406.

(Continued)

*Primary Examiner*—Basia Ridley
*Assistant Examiner*—Thanh-Truc Trinh
(74) *Attorney, Agent, or Firm*—Lisa K. Jorgenson; Allen, Dyer, Doppelt, Milbrath & Gilchrist, P.A.

(57) ABSTRACT

A photovoltaic device may include a housing having a transparent pupil receiving a collimated beam of radiation, and photovoltaic cell arrays being positioned on respective inner surfaces of the housing, each photovoltaic cell array sensing a respective spectral range of the radiation different from the other photovoltaic cell arrays. The photovoltaic device may further include dichroic filters being positioned along an optical axis of the transparent pupil and splitting the collimated beam into a corresponding divided beams of different spectrums, and mirrors corresponding to the divided beams. Each mirror may have reflecting surfaces, receive a respective divided beam, subdivide the received divided beam into reflected beams from the reflecting surfaces, and illuminate an active area of a photovoltaic cell of the respective array.

20 Claims, 5 Drawing Sheets

OTHER PUBLICATIONS

Barnett, Allen et al., "50% Efficient Solar Cell Architectures and Designs," Photovoltaic Energy Conversion, Conference of the 2006 IEEE 4th World Conference, ON, IEEE, PI, May 1, 2006, pp. 2560-2564.

Segal, Akiba et al., "Hybrid Concentrated Photovoltaic and Thermal Power Conversion at Different Spectral Bands," Solar Energy, Pergamon Press, Oxford, GB, vol. 76, No. 5, Jan. 1, 2004, pp. 591-601.

* cited by examiner

PHOTOVOLTAIC DEVICE WITH CONCENTRATION AND SPECTRAL SPLITTING OF COLLECTED LIGHT BEAM

FIELD OF THE INVENTION

This disclosure relates to photovoltaic power plants with concentration of radiation, and more particularly, to a photovoltaic device with concentration and spectral fractioning of the collected radiation.

BACKGROUND OF THE INVENTION

Photovoltaic power plants with light concentration reduce usage of expensive semiconductor resources. The typical approach may comprise a plurality of "discrete" cells with enhanced efficiency arranged on an appropriate substrate in closely packed arrays, each with an active area that may be from about 0.5 to about 4 cm$^2$, or even larger.

The cells may be of various types, for example, a stack structure of high efficiency double or triple junction cells comprising a topmost semiconductor layer of Gallium Indium Diphosphide (GaInP$_2$) over an intermediate semiconductor layer of Gallium Arsenide (GaAs), which is grown over a substrate of intermediate monocrystalline Germanium (Ge). The junctions, being between the top and the intermediate semiconductor layer and between the intermediate semiconductor layer and the substrate layer, may comprise two tunneling junctions. A rear metal layer and a metal contact formed on the top semiconductor layer may comprise the electric terminals of the cells. The surface area of the top semiconductor layer of Gallium Indium Diphosphide, not being covered by the metal contact, represents the active area of the cell and may be provided with a reflective transparent film.

Being possible to selectively optimize the structure of single cells to enhance their conversion efficiency for a specific region of the solar radiation spectrum, the overall conversion efficiency of the system may be significantly increased by splitting the spectrum of the collected radiation and directing beams of different parts of the spectrum toward the active surfaces of respectively dedicated cells to exploit the greatest sensitivity for radiation with wavelengths in the specific spectrum of maximum efficiency of the different cells.

To this end, parabolic mirrors for collecting and concentrating radiation in a beam have been disclosed. The beam is suitable for illuminating the active areas of the cells. The mirror surface may comprise a plurality of planar polyhedral mirrors that approximate a parabolic surface, and each planar polyhedral mirror tile forming the parabolic surface has superposed semi-reflective dichroic filter layers over a reflective substrate layer. In this way, the three or more reflective surfaces of different focal distances concentrate the solar spectrum in three distinct portions. The relative beams of which are directed onto three cells or arrays of cells with characteristics optimized for the specific region of the spectrum.

SUMMARY OF THE INVENTION

An objective of the present disclosure is to provide a photovoltaic device concentrating collected radiation and performing spectral splitting that does not use externally positioned complex light collecting/concentrating and spectrally conditioned focusing optical structures of large dimensions. All other optical elements and conversion semiconductor devices sensitive to direct exposure to atmospheric agents may be enclosed in a hermetically sealed box-like body, which is protected from dirt and effects of direct exposure to atmospheric agents.

This result may be obtained with a photovoltaic device that may comprise a plurality of photovoltaic cells of different spectral sensitivity, being disposed on respective areas of inner surfaces of a hermetically sealed box-like body provided with a transparent pupil with anti-reflection treatment of its surface. Through the pupil, a concentrated beam of collected radiation enters the device and a plurality of dichroic filters arranged in cascade on the optical axis of the transparent input pupil split the concentrated beam in distinct beams of different spectrum. Respective mirrors, each having multiple reflecting surfaces, intercept corresponding beams of spectral subdivision, and the multiple reflecting surfaces redirect the radiation in the form of a plurality of reflected beams, each illuminating the active area of a photovoltaic cells of a respective array.

DETAILED DESCRIPTION OF THE PREFERRED EMBODIMENTS

Figure 1:
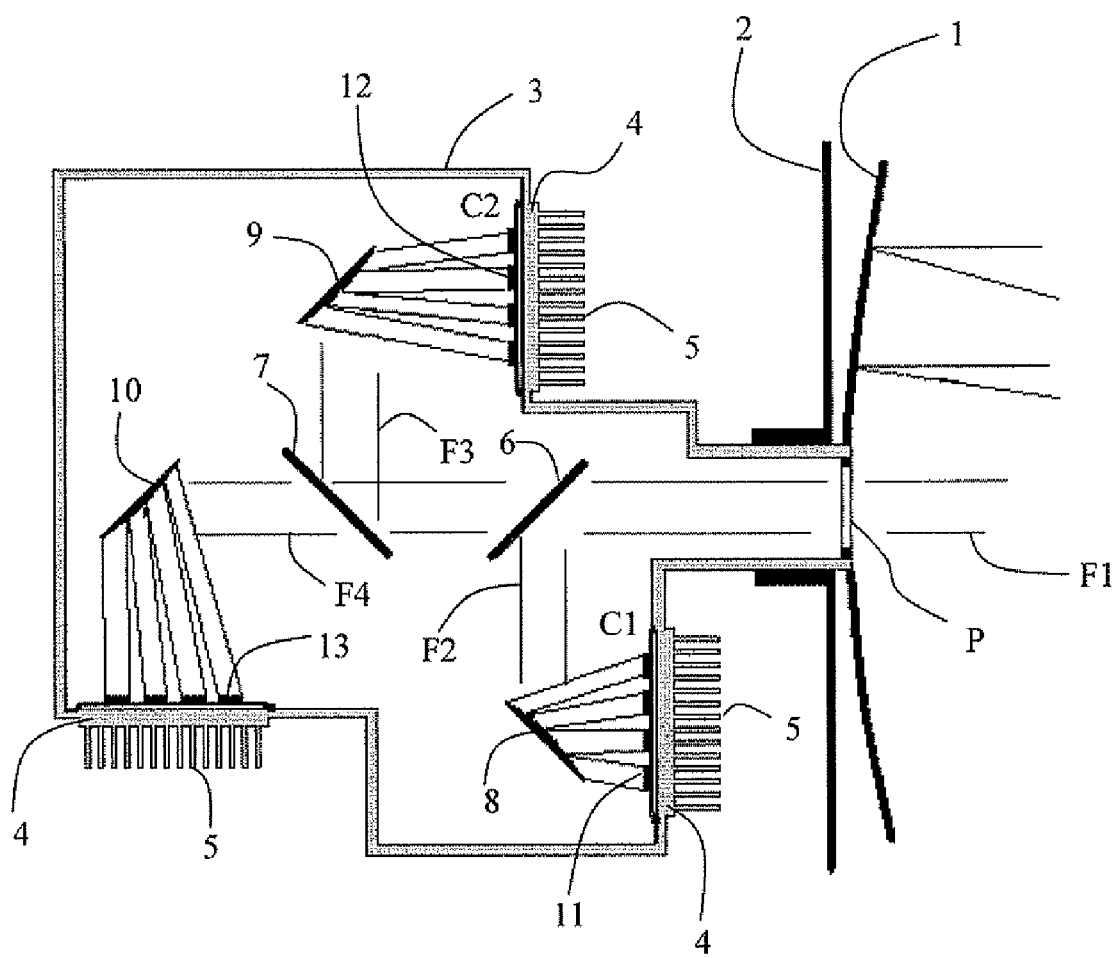
FIG. 1 is a schematic cross-sectional view of a photovoltaic device with concentration of the collected radiation and spectral split, according to the present invention.

Referring to FIG. 1, the collecting parabolic mirror for concentrating solar radiation on the surface of a countermirror (not depicted in the figure, typically having the same focal point of the collection mirror, but much closer thereto for reducing its size and thus shadowing) and the related supporting structure are schematically illustrated by the traces 1 and 2 of a portion of the whole collection structure that may have a size in the order of one or more meters.

When the assembly is completed, the box-like body 3 defines an inner space hermetically isolated from atmospheric agents such as rain, dust, soot and the like. The box-like body 3 may be of any material resistant to corrosive actions of atmospheric agents and at least partially of a metallic material of good thermal conductivity, and has at least an opening sealed by a pupil P of a transparent material. Aluminum and alloys thereof, copper, brass, titanium are exemplary metallic material suitable for building the hermetically sealed box-like body 3 or at least some parts thereof.

The pupil P may be made of fused silica and preferably has on both faces a film of anti-reflective material that may include thin films of materials of different refraction index, such as, for example, MgO, ITO, $Ta_2O_5$, $ZrO_2$, $TiO_2$, $SiO_2$, $MgF_2$ or other material with suitable optical properties, and being resistant to atmospheric agents and to the functioning conditions of the photovoltaic device.

In the illustrated example, the entrance pupil P of the concentrated beam F1 of collected radiation, slightly protrudes from the parabolic surface of the primary mirror 1 through an opening thereof. Toward which and in collimation with the optical axis of the entrance pupil, the concentrated primary beam F1 is directed from the focal counter-mirror of the collection parabolic mirror. Alternatively, the pupil P may flush or even be slightly recessed from the aperture of the parabolic mirror and reached by the concentrated beam through the aperture.

The whole box-like body 3 or large part thereof may be made of high conductivity metal with common carpentry and assembly techniques of component pieces ensuring an air-tight sealing from external atmospheric agents, or may comprise cast or molded parts of a metal alloy having appropriate characteristics of small thermal elongation, lightness, and mechanical strength. Aluminum, aluminum alloys, light alloys, copper, bronze, brass, titanium, nickel and nickel alloys, such as the class of Hastelloy alloys, are exemplary materials that can be used for making the box-like body 3.

In the depicted example of FIG. 1, the box-like body 3 may be of cast aluminum light alloy closed hermetically by a flat cover with an appropriate gasket (for example, a silicon rubber or other elastomer resistant to atmospheric agents), not depicted in the figure, the shapes of which may be easily determined by the skilled person.

Realization of the box-like body 3 by casting or die-stamping techniques may facilitate the formation of a thicker wall 4 provided with adequate external fins 5 for favoring dissipation of heat generated by unconverted radiation by the photovoltaic cells of the array distinct arrays C1, C2 and C3 of photovoltaic cells disposed on the inner surface of the thickened wall 4.

Even if not illustrated in FIG. 1, it is evident to the skilled person that the box-like base of the body 3 may be provided with appropriate internal brackets for mounting and fixing at positions of maximum collimation dichroic filters 6 and 7 in cascade for splitting the primary beam F1 in three distinct beams F2, F3 and F4 with spectral splitting by the respective mirrors 8, 9 and 10. The surfaces of the inner fixing areas of boards 11, 12, 13, upon which discrete photovoltaic cells are organized, may be adequately planar and smooth for enhancing thermal coupling with the boards.

In the exemplary embodiment of FIG. 1, the two dichroic filters in cascade 6 and 7 installed along the optical entrance axis, of the primary beam of concentrated radiation F1 through the pupil P, split the primary beam in distinct beams F2, F3 and F4, each having a different spectrum from the others. Of course, a different number of spectral splitting filters of the collected radiation may be deployed.

For example, the first dichroic filter 4 may be a layer of fused silica of a thickness of one or more millimeters, having on the surface exposed to the incident radiation a stack of films of different optical characteristics and thickness adapted to reflect the "blue" region of the solar spectrum and let pass radiation of other regions of the solar spectrum. The second dichroic filter may also be a layer of fused silica having on the surface exposed to the incident radiation a different stack of films of different optical characteristics and thickness adapted to reflect the "green" region of the solar spectrum and to let pass radiation of the "red" region.

Each beam of spectral subdivision of the concentrated primary beam F1 is intercepted by a respective mirror 6, 7, 8, that generally has a plurality of reflecting surfaces, for example, a plurality of facets of appropriate incidence angles in respect to the collimated, concentrated and spectrally filtered beam of collected radiation, to subdivide the reflected radiation into a plurality of beams, typically with divergent axis. Each reflected beam is directed to illuminate the active area of a single or of a plurality of adjacent photovoltaic cells of a respective array of cells having their peak sensitivity centered or at least comprised in the spectrum of wavelength of the spectral subdivision beam of the collected radiation. Commonly, on the surface of the active area of the cells, there is a transparent anti-reflective layer, according to typical optical matching techniques.

In the depicted example, the three distinct arrays C1, C2, C3 of photovoltaic cells are disposed over respective areas of inner surfaces of the box-like body 3, advantageously spatially distributed not to be contiguous or too close to each other, in order to space apart the zones subjected to heating up because of the heat generated by impinging radiation unconverted by the photovoltaic cells of the receiving array.

A good thermal coupling through the supporting board of the cells of each array with an external heat sink 3 ensures dissipation to atmosphere of heat generated inside the hermetically sealed box-like body by the unconverted radiation. The outer surface of the hermetically sealed box-like body 3 may be shaped as a (or alternatively thermally coupled to) dissipating body, typically finned or with a shape adapted to favor heat dissipation in the atmosphere, at least in direct correspondence with the areas of application on the inner surface of the wall of an array of photovoltaic cells.

In the exemplary embodiment of FIG. 1, dissipation fins 5 protrude out of the outer surface of a thickened zone 4 of the metallic wall of the body 3. The organization of discrete photovoltaic cells, to realize an array of cells with optimized characteristics for a particular region of the spectrum of the solar radiation according to a certain series-parallel scheme, may assume a layout as that illustrated schematically in FIG. 2a and in the layout view of FIG. 2B.

As it may be noticed, the single discrete photovoltaic cells 11 may have a rectangular active area (section), partially hidden (masked) by the profile of the structure shaped as a comb-like collector of a metal layer 14 of upper electrical contact of the structure with a plurality of junctions of the photovoltaic cell. Further, keeping an adequate dimensioning of the metal current conduction sections, the metal structure of the upper contact 14 may have a layout adapted to minimize blinding, i.e. the reduction of active area of the cell illuminated by the radiation.

The second current terminal contact of each photovoltaic cell may be commonly established by proper patterning of the metal layer 15 on the surface of a printed circuit board (PCB) upon which also terminal collector parts 15, connectable through bond wires 16 to electrical pads of the receiving assembly of photoelectric conversion of the collected radiation (not depicted in figure), may be defined. The connection according to the design series-parallel scheme of the array of cells may be typically realized with bond wires 17 welded upon pads of the upper contact metal layer 14 and upon pads, properly defined, of the superficial metal layer 15 of the board upon which it lays, thus establishing also the electric connection of each photovoltaic cell 11, according to typical assembly techniques of electronic devices on PCB.

Figure 2A:
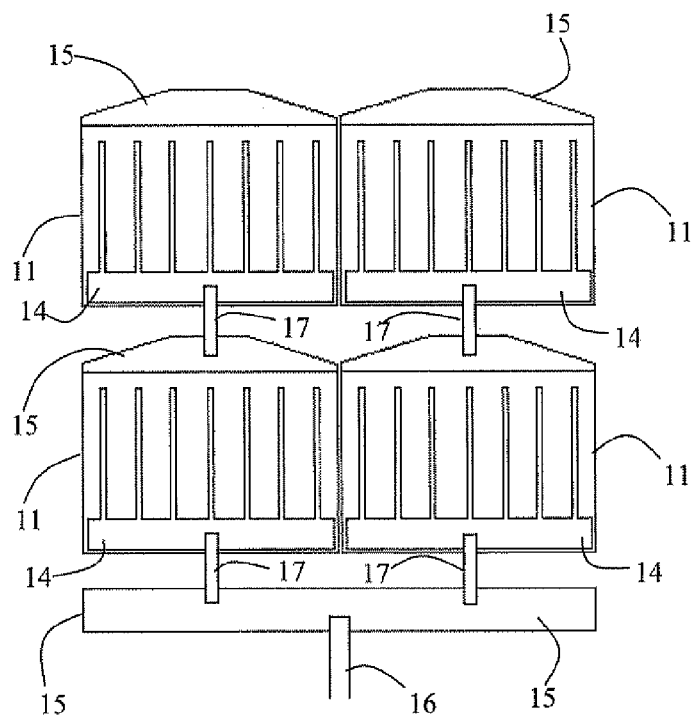
FIGS. 2a and 2b are schematic top plan and side elevation views of an array of discrete photovoltaic cells organized on a printed circuit board, according to the present invention.
Figure 2B:
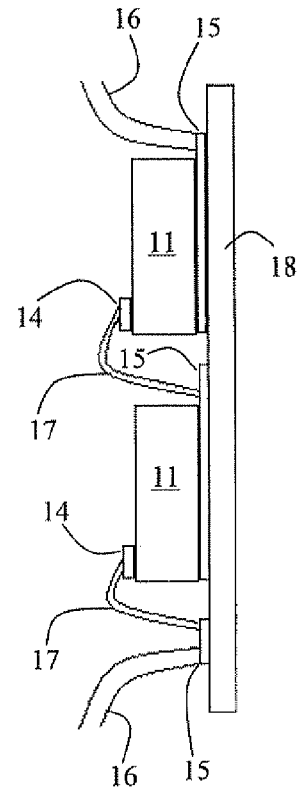

FIG. 2B is an elevation view of the board that carries the cells, the substrate layer of dielectric material 18 of which may withstand to the relatively high temperatures due to conversion into heat of the part of radiation that is not converted by the photovoltaic cells. A thin ceramic layer, or a glass layer or a cermet with adequate dielectric characteristics is suitable for this application even if other materials with similar characteristics may be used.

As it may be easily noticed from the partial layout view of FIG. 2A, it is possible for juxtaposing the discrete cells 11 side-by-side in a two-dimensional array row-side, practically without gaps among them, and providing minimum spacing between cells because of the need of establishing wire connectors 17 between cells, column-wise. The overall layout of an array thus has parallel gaps between the active surfaces of cells of adjacent rows. The area of these gaps, added to the inactive terminal areas and to the areas of the metal strips 15 of top contact of cells, may be a non negligible percentage of the overall array area. It is thus important from the point of view of conversion efficiency to split the radiation in multiple beams, each defined and directed to illuminate only and exclusively the active areas of the cells of the array.

According to the embodiment illustrated in FIG. 2A, it is evident that such a need of splitting the beam of useful radiation into a plurality of beams on the active areas fulfillment of this requirement no longer requires subdivision into numerous beams, each directed toward the active area of a single cell, but much more simply into a plurality of beams each adapted to illuminate the active area of all the cells disposed on a same row (according to a "mono-directional" splitting instead of a "bi-directional" splitting), thus greatly simplifying the structure of the splitting mirrors 8, 9 and 10.

Figure 3:
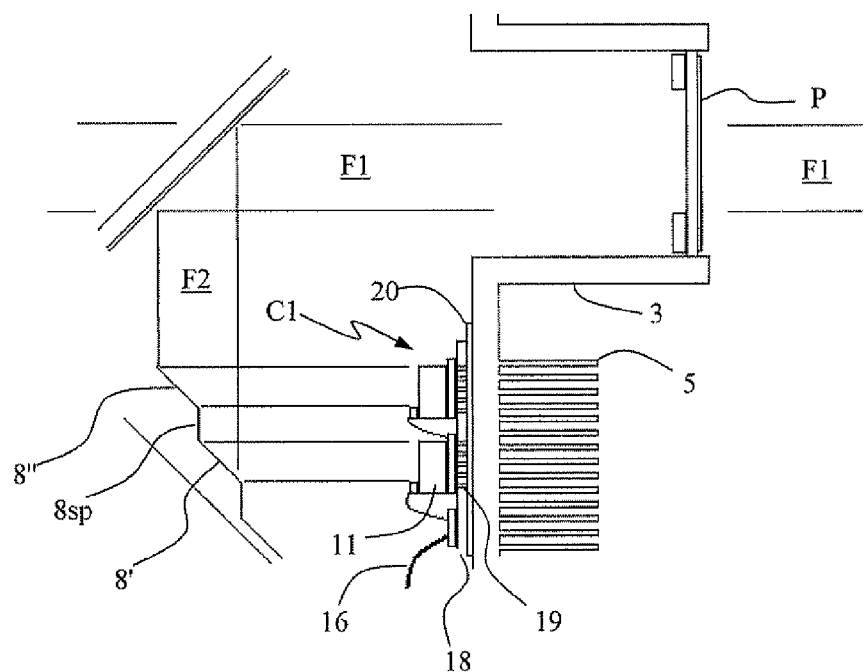
FIG. 3 depicts an embodiment of redirection of multiple illuminating beams using a mirror with stepped planar reflective surfaces, according to the present invention.

FIG. 3 depicts an embodiment of the device that uses a stepped mirror with planar reflecting surfaces. The schematic cross-sectional partial view of FIG. 3 illustrates the stepped shape of the mirror 8sp that intercepts the beam F2, spectrally split from the primary beam F1. The multiple planar reflecting surfaces 8' and 8" illuminate the active areas of the photovoltaic cells 11, juxtaposed along respective rows of the array C1. Of course, the cells array may have a theoretically unlimited number of rows and columns, and correspondingly the stepped mirror may have a number of distinct reflecting surfaces equal to the number of rows of the cell array.

In the example illustrated in FIG. 3, a particular embodiment of the printed circuit board is shown, wherein a dielectric substrate layer 18 of which, because of its nature and/or the impossibility to reduce its thickness beyond a certain limit, may represent an insufficiently conducting layer limiting heat dissipation properties. In these cases, the relatively thick body 18 of dielectric material of low thermal conductivity may have holes, drilled underneath the fixing pads of the cells, filled with a heat conducting metallic material, that may be planar on the coupling face of the board.

In this case, the plurality of metal filled holes establish effective thermal bridges 19 of heat conduction from the bottom of the photovoltaic cells 11 towards the coupling wall and the electric insulation of the bottom contacts of the cells is ensured by a thin dielectric layer 20. The dielectric layer 20 is not required to possess any significant mechanical strength and may be made thin enough not to hinder heat transmission from the bottom of the cells to the externally finned metal wall of the box-like body 3. Thin layers of mica or of any other suitable dielectric may be used according to typical assembling techniques of electronic components.

Figure 4:
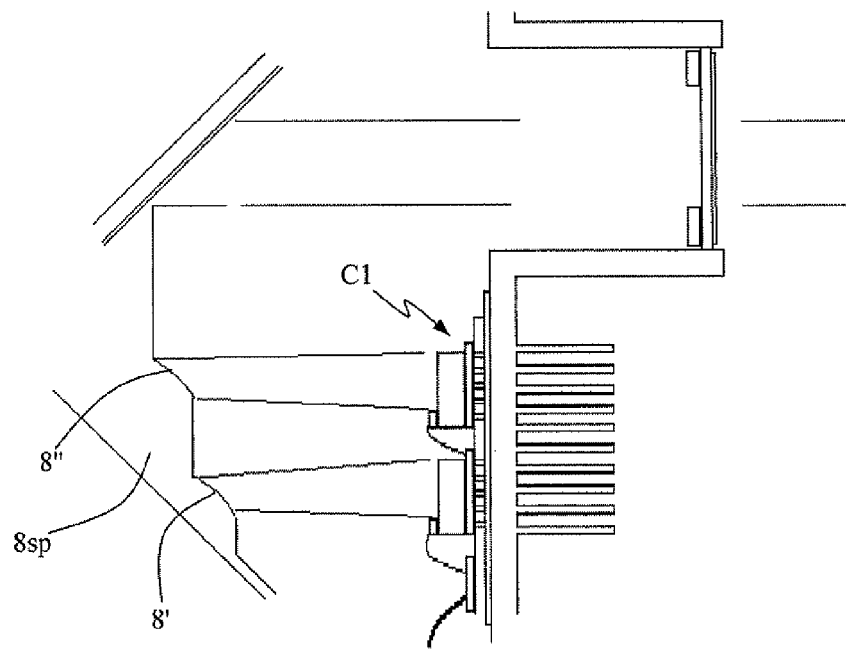
FIG. 4 depicts an embodiment of redirection of multiple illuminating beams using a mirror with convex reflective surfaces, according to the present invention.

FIG. 4 illustrates a partial schematic sectional view of another embodiment, wherein the cells 11 of a row may have active areas of identical or different size from the active area of the cells disposed along another row of the array. In this case, it is possible to use an illumination mirror of the active areas of the array 8sp still having a stepwise geometry with the different reflecting surfaces 8' and 8" having different convex profiles differentiating the "opening" of the reflected beams in order to illuminate the active areas of the cells with substantially the same density of luminous energy even if of different size and/or disposed at different distance from the respective convex reflecting surface.

Moreover, there could be a problem in correctly dimensioning the total active area of an array of cells in respect to total active areas of the other cell arrays for balancing the active area of the distinct cell arrays, typically for the red radiation in respect to blue and green radiations. This is because the energy content in regions of the solar spectrum as commonly split by dichroic filters, as those used in the illustrated embodiment is not identical, rather it is significantly different as also is the conversion efficiency of the semiconductor devices (photovoltaic cells) used for converting in different regions of the spectrum as well as the optimal working temperature of photovoltaic cells for different spectral regions. For all these reasons, the density of energy irradiated onto the active surface of each array may be properly controlled for preventing conditions of over-illumination that could cause excessive temperatures and damage the cells or for keeping the density at an optimal level for attaining the maximum conversion yield.

Since the entering beam F1 is concentrated by the primary mirror and by the counter-mirror of fixed size as also is the active area of the discrete cells deployed, it is useful to be able to vary the illumination energy density of the cells of the distinct arrays for the spectral subdivision regions of the collected radiation, in an installed and functioning conversion apparatus by modifying either the curvature of the reflecting surfaces of the stepped mirror or the inclination of the planar array of cells such to attain a satisfactory density of illumination of the active areas of the cells.

Figure 5:
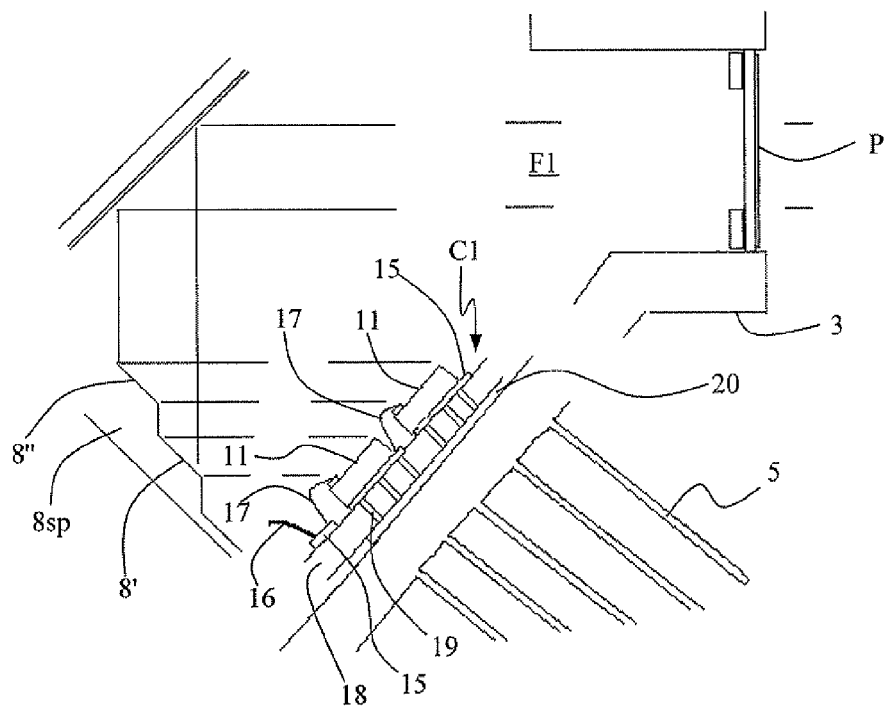
FIG. 5 depicts an embodiment of redirection of multiple illuminating beams using a mirror with planar reflective surfaces and cells mounted in a slanted position, according to the present invention.
Figure 6:
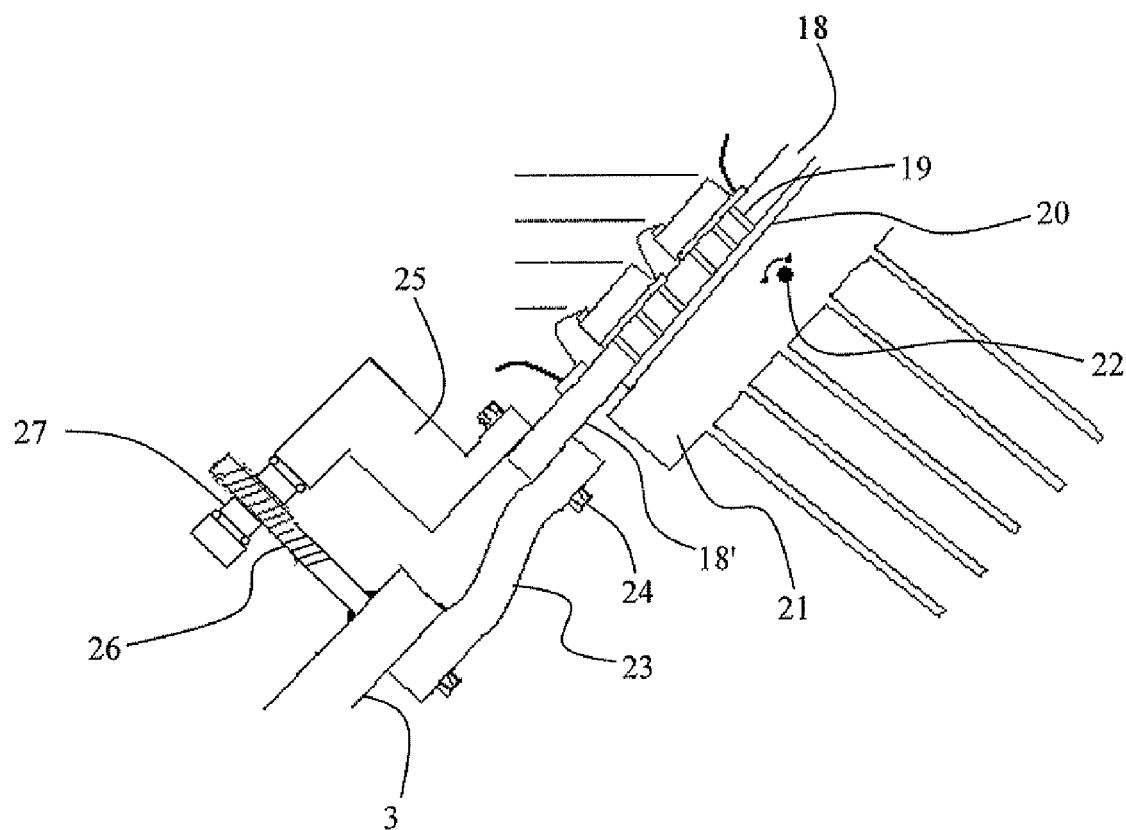
FIG. 6 is a schematic diagram of a nut adjustment pivoting structure for trimming the angle of incidence of a receiving array of photovoltaic cells, according to the present invention.
Figure 7:
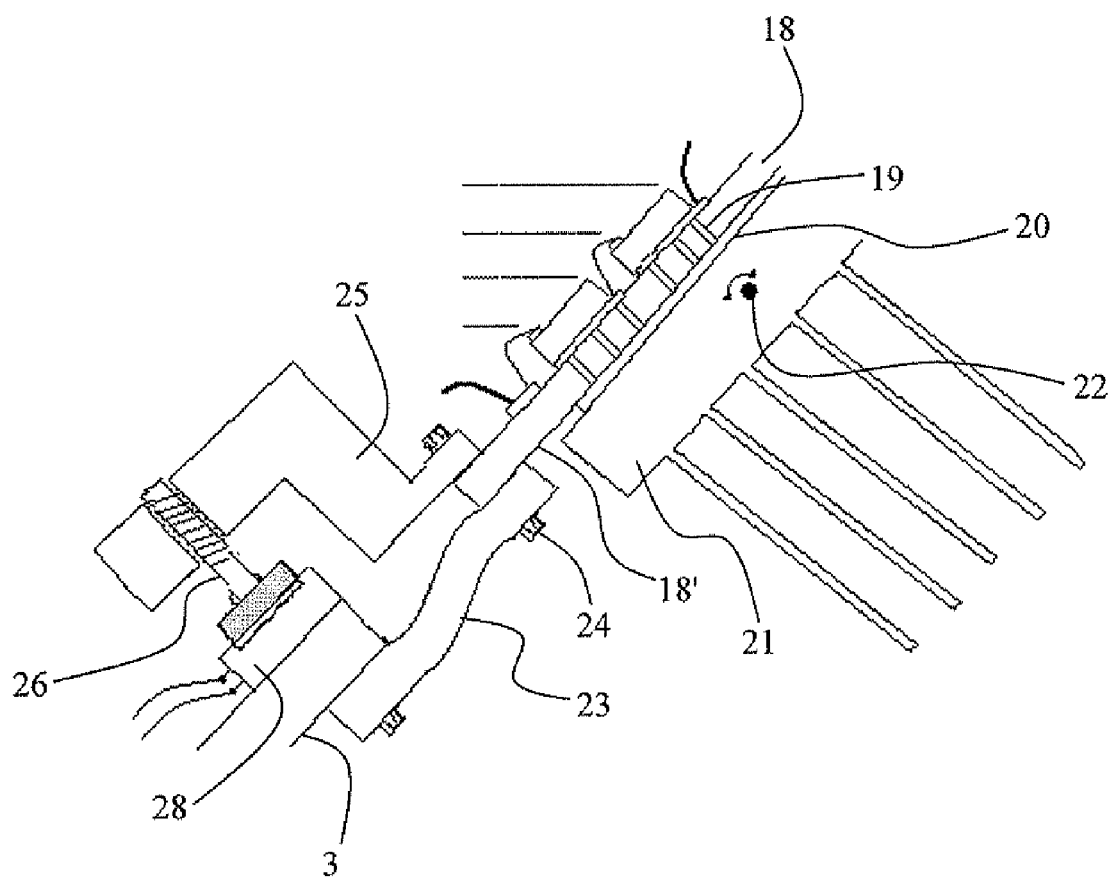
FIG. 7 is a schematic diagram of a rotating die adjustment pivoting structure for trimming the angle of incidence of the receiving array of photovoltaic cells, according to the present invention.

To this end, the alternative embodiment of a device according to this disclosure contemplates the possibility that the arrays of photovoltaic cells be oriented at a certain angle of inclination from the optical axis of the entering beam F1 as shown in FIGS. 5, 6, and 7, instead of being in parallel or orthogonal to it. Of course, the thickness of the anti-reflective multi-layer films present on the surface of the active area of the cells should be adapted to the incidence angle of the light beam.

Referring to FIG. 5, the array C1 of photovoltaic cells 11 may be inclined at a certain angle from the reference optical axis of the entering concentrated beam F1. Depending on the eventual need of having subdivision beams of different sizes for matching the dimensions of the active area of cells disposed on different rows of an array, a stepped mirror 8sp with planar reflecting surfaces may be used as shown or, in case of cells of different active area, a stepped mirror with convex reflecting surfaces may be used, similarly to what already illustrated in relation to the embodiment of FIG. 4. In both cases, the possibility of adjusting the angle of inclination of the array within a certain range allows for increasing or reducing the incident energy density on the active area of the cells of the array, adapting it to the working characteristics of the cells.

An embodiment with enhanced capacity of regulating the energy density for optimal illumination of the active area of the photovoltaic cells, depending on appropriate functioning parameters of the cells, is illustrated in FIG. 6. According to this embodiment, the array of photovoltaic cells typically assembled on a printed circuit board may be associated to a finned heat dissipation body, securing electrical insulation and a good thermal coupling between the array of cells organized on a printed circuit board and the dissipating body 21, for example, by interposing a thin dielectric film 20, to form an essentially rigid composite panel. The assembly is capable of oscillating around a bearing pivot 22 passing through a hole that crosses from side-to-side the dissipating body 21, and the ends of which are rotatable and sustained in appropriate supports (not shown in the cited figure) integral with the outer side of the box-like body 3, that project themselves in proximity of the edge of an aperture through the wall of the box-like body 3 of size sufficient to contain the substantially planar rigid assembly of the array and of the dissipating body.

The hermetic seal of the inner space of the box-like body 3 is ensured by a flexible sealing gasket 23 applied around the whole perimeter of a projecting portion in form of a perimeter-based flange 18' of the substrate of the printed circuit board that carries the cells, fixed, for example, with a plurality of bolts 24 that may be tightened onto an eventual counter flange.

At least a double "L" or step bracket 25 is fixed to an end of the printed circuit board 18 and its position in respect to a threaded pivot 26 integral to the inner wall of the box-like body may be modified by shifting an adjustment nut 27 mechanically connected to the bracket 25, along the threaded pivot 26, according to common automatic positioning techniques along an axis (i.e. axis of the threaded pivot 26). The yielding of the flexible gasket 23, that may comprise silicon rubber, neoprene, or similar material resistant to atmospheric agents, for example, allows a sufficiently ample regulation range of the slope. In this way, the final disposition of the array of cells and, in particular, the slope angle may be trimmed for optimizing the energy density of illumination of the active areas of the cells of the array, once the mirror that splits the radiation in beams directed toward the active areas of the cells of the array has been set in place.

Mounting the array with an adjustment fulcrum 22 and the possibility of varying the slope angle with common actuating means or a common actuator module, typically electromagnetic means, offers the possibility of implementing a closed loop control systems capable of maintaining an optimal illumination of the active areas of the cells by automatically compensating a possible degradation of illumination conditions of the active area of the cells of an array that may be caused by thermal expansion and large fluctuations of the intensity of the collected radiation.

FIG. 7 illustrates the deployment of a threaded pivot 26 engaged into a threaded hole of the bracket 25, moved by a motor 28 for regulating the position of the bracket 25 and thus the inclination of the pivoted assembly of the cells array. The illuminating mirrors 8, 9, 10 may be made of glass with a surface that has been made highly reflecting by depositing metal layers (e.g., Al, Ag, Au) coated with a protective transparent film (e.g., $SiO_2$, $TiO_2$) or made of polished metal (e.g., Al, Ni, Ag) coated with a protective transparent film of a dielectric material.

That which is claimed is:

1. A photovoltaic device for converting collected solar radiation comprising:
    a sealed housing having a transparent pupil receiving a collimated beam of the collected solar radiation;
    a plurality of photovoltaic cell arrays, each photovoltaic cell array being sensitive to a respective spectral region of the collected solar radiation different from the other photovoltaic cell arrays and being placed on respective inner surfaces of said sealed housing;
    a plurality of dichroic filters being arranged in cascade along an optical axis of said transparent pupil and splitting the collimated beam into a corresponding plurality of divided beams of different spectrums; and
    a plurality of mirrors corresponding to said plurality of divided beams, each mirror
        having a plurality of reflecting surfaces, receiving a respective divided beam, and
        subdividing the received divided beam into a plurality of reflected beams from said plurality of reflecting surfaces and being directed for illuminating an active area of a photovoltaic cell of the respective array.

2. The photovoltaic device according to claim 1 further comprising a primary radiation collection mirror having a central opening aligned with said transparent pupil, and a counter mirror cooperating therewith for generating the collimated beam of the collected solar radiation directed toward said central opening of the primary radiation collection mirror.

3. The photovoltaic device according to claim 1 wherein said sealed housing comprises a material having a first threshold thermal conductivity, and a plurality of heat sinks on surfaces of said sealed housing and aligned with said plurality of photovoltaic cell arrays.

4. The photovoltaic device according to claim 1 wherein each dichroic filter comprises:
    an optical grade glass plate with a surface area for receiving the collimated beam; and
    a multilayer film over the surface area of said optical grade glass plate, each layer comprising material having a differing refraction index and thickness for providing a desired dichroic effect.

5. The photovoltaic device according to claim 1 wherein the plurality of reflecting surfaces of each mirror defines a convex-polyhedric surface; and wherein each flat polyhedric facet of the convex-polyhedric surface reflects one of the plurality of reflected beams with cross-section and direction for illuminating the active area of the photovoltaic cell of the respective array.

6. The photovoltaic device according to claim 1 wherein the plurality of reflecting surfaces of each mirror defines a plurality of flat reflecting surfaces, each flat reflecting surface reflecting a beam with cross-section and direction for illuminating the active area of the photovoltaic cell of the respective array, the photovoltaic cells being arranged flank-to-flank along a row of the respective array arranged in rows and columns.

7. The photovoltaic device according to claim 1 wherein the plurality of reflecting surfaces of each mirror defines a plurality of convex reflecting surfaces, each convex reflecting surface reflecting a beam with cross-section and direction for illuminating the active area of the photovoltaic cell of the respective array, the photovoltaic cells being arranged flank-to-flank along a row of the respective array arranged in rows and columns.

8. The photovoltaic device according to claim 1 wherein each photovoltaic cell array includes a printed circuit board comprising a front surface metal layer; and wherein said front surface metal layer is geometrically defined in islands for electrically coupling with a bottom contact metal layer of at least one of the photovoltaic cells positioned flank-to-flank of the respective photovoltaic cell array organized in rows and columns.

9. The photovoltaic device according to claim 8 wherein said printed circuit board further includes a dielectric substrate adjacent said front surface metal layer comprising a material of at least one of a ceramic, a glass, and a cermet.

10. The photovoltaic device according to claim 9 wherein said dielectric substrate includes a plurality of passageways filled with a heat conducting metallic material, thereby providing a thermal bridge for transferring heat from the bottom of the photovoltaic cells across the thickness of the dielectric substrate to a thermal coupling surface of a heat sink.

11. The photovoltaic device according to claim 10 further comprising a dielectric layer between the heat conducting metallic material filling the passageways and the heat sink.

12. The photovoltaic device according to claim 8 wherein the printed circuit board is directly coupled to a metal heat sink and is fixed onto a perimeter of a flexible annular gasket; wherein the perimeter of the flexible annular gasket is fixed onto a perimeter rim of an opening through said sealed housing; wherein an assembly of each photovoltaic cell array and each metal heat sink is pivotally positioned by a pin passing through a passageway across a width of the metal heat sink, the pin being positioned at two ends by brackets positioned onto an external surface of said sealed housing; and the photovoltaic device further comprising:
   an inner bracket coupled to an edge of the printed circuit board of the photovoltaic cell array and being shifted along a threaded pin for modifying an inclination angle of the photovoltaic cell array carried by the printed circuit board.

13. A photovoltaic device comprising:
   a housing;
   a plurality of photovoltaic cell arrays carried by said housing, each photovoltaic cell array sensing a respective different spectral range of radiation;
   a plurality of dichroic filters being carried by said housing, being positioned along an optical path of an input beam, and splitting the input beam into a corresponding plurality of divided beams of different spectrums; and
   a plurality of mirrors corresponding to said plurality of divided beams and also being carried by said housing, each mirror having a plurality of reflecting surfaces to subdivide a respective divided beam into a plurality of reflected beams from said plurality of reflecting surfaces and onto photovoltaic cells of the respective array.

14. The photovoltaic device according to claim 13 further comprising a primary radiation collection mirror having a central opening aligned with the optical path, and a counter mirror cooperating therewith for generating the input beam of the radiation directed toward said central opening of the primary radiation collection mirror.

15. The photovoltaic device according to claim 13 wherein said housing comprises a material having a first threshold thermal conductivity, and a plurality of heat sinks on external surfaces of said housing and aligned with said plurality of photovoltaic cell arrays.

16. The photovoltaic device according to claim 13 wherein each dichroic filter comprises:
   an optical grade glass plate with a surface area for receiving the input beam; and
   a multilayer film over the surface area of said optical grade glass plate, each layer comprising material having a differing refraction index and thickness for providing a desired dichroic effect.

17. A method of making a photovoltaic device comprising:
   providing a housing to receive an input beam of radiation;
   positioning a plurality of photovoltaic cell arrays to be carried by the housing, each photovoltaic cell array sensing a respective different spectral range of radiation;
   positioning a plurality of dichroic filters to be carried by the housing along an optical path of the input beam for splitting the input beam into a corresponding plurality of divided beams of different spectrums; and
   positioning a plurality of mirrors corresponding to the plurality of divided beams and also to be carried by the housing, each mirror having a plurality of reflecting surfaces to subdivide a respective divided beam into a plurality of reflected beams from the plurality of reflecting surfaces and onto photovoltaic cells of the respective array.

18. The method according to claim 17 further comprising positioning a primary radiation collection mirror having a central opening to be aligned with the optical path, and positioning a counter mirror cooperating with the primary radiation collection mirror for generating the input beam of the radiation directed toward the central opening of the primary radiation collection mirror.

19. The method according to claim 17 wherein the housing comprises a material having a first threshold thermal conductivity, and a plurality of heat sinks on surfaces of the housing and aligned with the plurality of photovoltaic cell arrays.

20. The method according to claim 17 wherein each dichroic filter comprises:
   an optical grade glass plate with a surface area for receiving the input beam; and
   a multilayer film over the surface area of the optical grade glass plate, each layer comprising material having a differing refraction index and thickness for providing a desired dichroic effect.

* * * * *